United States Patent
Lin

(10) Patent No.: US 11,917,836 B2
(45) Date of Patent: Feb. 27, 2024

(54) RESISTIVE RANDOM ACCESS MEMORY STRUCTURE

(71) Applicant: United Microelectronics Corp., Hsinchu (TW)

(72) Inventor: Zong-Han Lin, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 341 days.

(21) Appl. No.: 17/513,851

(22) Filed: Oct. 28, 2021

(65) Prior Publication Data

US 2023/0137853 A1 May 4, 2023

(51) Int. Cl.
*H10N 70/00* (2023.01)
*H10B 63/00* (2023.01)

(52) U.S. Cl.
CPC ........... *H10B 63/30* (2023.02); *H10N 70/841* (2023.02); *H10N 70/8833* (2023.02)

(58) Field of Classification Search
CPC ... H10B 63/30; H10N 70/841; H10N 70/8833
See application file for complete search history.

(56) References Cited

U.S. PATENT DOCUMENTS

| | | | | |
|---|---|---|---|---|
| 9,023,699 B2* | 5/2015 | Chang | ............... | H10N 70/8833 438/785 |
| 2005/0045919 A1* | 3/2005 | Kaeriyama | ......... | G11C 13/0011 257/E27.098 |
| 2015/0060749 A1* | 3/2015 | Nakakubo | .............. | H10B 63/30 438/238 |
| 2021/0074765 A1* | 3/2021 | Reznicek | ............... | H10B 63/80 |

* cited by examiner

*Primary Examiner* — Allison Bernstein
*Assistant Examiner* — Margaret B Hayes
(74) *Attorney, Agent, or Firm* — JCIPRNET

(57) ABSTRACT

The invention provides a RRAM structure, which includes a substrate, a high voltage transistor, and a RRAM cell. The high voltage transistor includes a drift region, a gate structure, a source region, a drain region, and an isolation structure. The drift region is located in the substrate. The gate structure is located on the substrate and on a portion of the drift region. The source region and the drain region are located in the substrate on two sides of the gate structure. The drain region is located in the drift region. The isolation structure is located in the drift region and between the gate structure and the drain region. The RRAM cell includes a first electrode, a resistive switching layer, and a second electrode sequentially located on the drain region. The RRAM cell is electrically connected to the high voltage transistor.

20 Claims, 3 Drawing Sheets

RESISTIVE RANDOM ACCESS MEMORY STRUCTURE

BACKGROUND OF THE INVENTION

Field of the Invention

The invention relates to a semiconductor structure, and particularly relates to a resistive random access memory (RRAM) structure.

Description of Related Art

The RRAM includes a RRAM cell and a transistor electrically connected with each other. In the operation of the RRAM, the forming process is performed by applying the forming voltage. However, as the size of the RRAM continues to shrink, the forming voltage of the forming process is getting higher and higher. Therefore, when the transistor cannot sustain the high voltage, the transistor will be damaged by the forming voltage of the forming process, thereby reducing the electrical performance of the RRAM.

SUMMARY OF THE INVENTION

The invention provides a RRAM structure, which can improve the electrical performance of the RRAM.

The invention provides a RRAM structure, which includes a substrate, a high voltage transistor, and a RRAM cell. The high voltage transistor includes a drift region, a gate structure, a source region, a drain region, and an isolation structure. The drift region is located in the substrate. The gate structure is located on the substrate and on a portion of the drift region. The source region and the drain region are located in the substrate on two sides of the gate structure. The drain region is located in the drift region. The isolation structure is located in the drift region and between the gate structure and the drain region. The RRAM cell includes a first electrode, a resistive switching layer, and a second electrode sequentially located on the drain region. The RRAM cell is electrically connected to the high voltage transistor.

According to an embodiment of the invention, in the RRAM structure, the high voltage transistor and the RRAM cell may be connected in series.

According to an embodiment of the invention, in the RRAM structure, the first electrode may be electrically connected to the drain region.

According to an embodiment of the invention, the RRAM structure may further include a contact. The contact is located between the first electrode and the drain region.

According to an embodiment of the invention, in the RRAM structure, the high voltage transistor may further include a well region. The well region is located in the substrate.

According to an embodiment of the invention, in the RRAM structure, the gate structure may be located on a portion of the well region.

According to an embodiment of the invention, in the RRAM structure, the source region may be located in the well region.

According to an embodiment of the invention, in the RRAM structure, the well region may be separated from the drift region.

According to an embodiment of the invention, in the RRAM structure, the well region may have a first conductive type, and the drift region, the source region, and the drain region may have a second conductive type.

According to an embodiment of the invention, in the RRAM structure, the high voltage transistor may further include a dummy gate structure. The dummy gate structure is located on the substrate and between the isolation structure and the drain region.

The invention provides another RRAM structure, which includes a substrate, a high voltage transistor, and a RRAM cell. The substrate has at least one fin structure. The high voltage transistor includes a drift region, a gate structure, a dummy gate structure, a source region, a drain region, and an isolation structure. The drift region is located in the fin structure. The gate structure is located on the fin structure and on a portion of the drift region. The dummy gate structure is located on the fin structure and on the drift region. The source region and the drain region are located in the fin structure on two sides of the gate structure and the dummy gate structure. The drain region is located in the drift region. The isolation structure is located in the drift region and between the gate structure and the dummy gate structure. The RRAM cell includes a first electrode, a resistive switching layer, and a second electrode sequentially located on the drain region. The RRAM cell is electrically connected to the high voltage transistor.

According to another embodiment of the invention, in the RRAM structure, the high voltage transistor and the RRAM cell may be connected in series.

According to another embodiment of the invention, in the RRAM structure, the first electrode may be electrically connected to the drain region.

According to another embodiment of the invention, the RRAM structure may further include a contact. The contact is located between the first electrode and the drain region.

According to another embodiment of the invention, in the RRAM structure, the contact may be a slot contact.

According to another embodiment of the invention, in the RRAM structure, the high voltage transistor may further include a well region. The well region is located in the fin structure.

According to another embodiment of the invention, in the RRAM structure, the gate structure may be located on a portion of the well region.

According to another embodiment of the invention, in the RRAM structure, the source region may be located in the well region.

According to another embodiment of the invention, in the RRAM structure, the well region may be separated from the drift region.

According to another embodiment of the invention, in the RRAM structure, the well region may have a first conductive type, and the drift region, the source region, and the drain region may have a second conductive type.

Based on the above description, in the RRAM structure according to the invention, the RRAM cell is electrically connected to the high voltage transistor. Since the high voltage transistor can sustain high voltage, the high voltage transistor can be prevented from being damaged by the forming voltage of the forming process, thereby improving the electrical performance of the RRAM.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
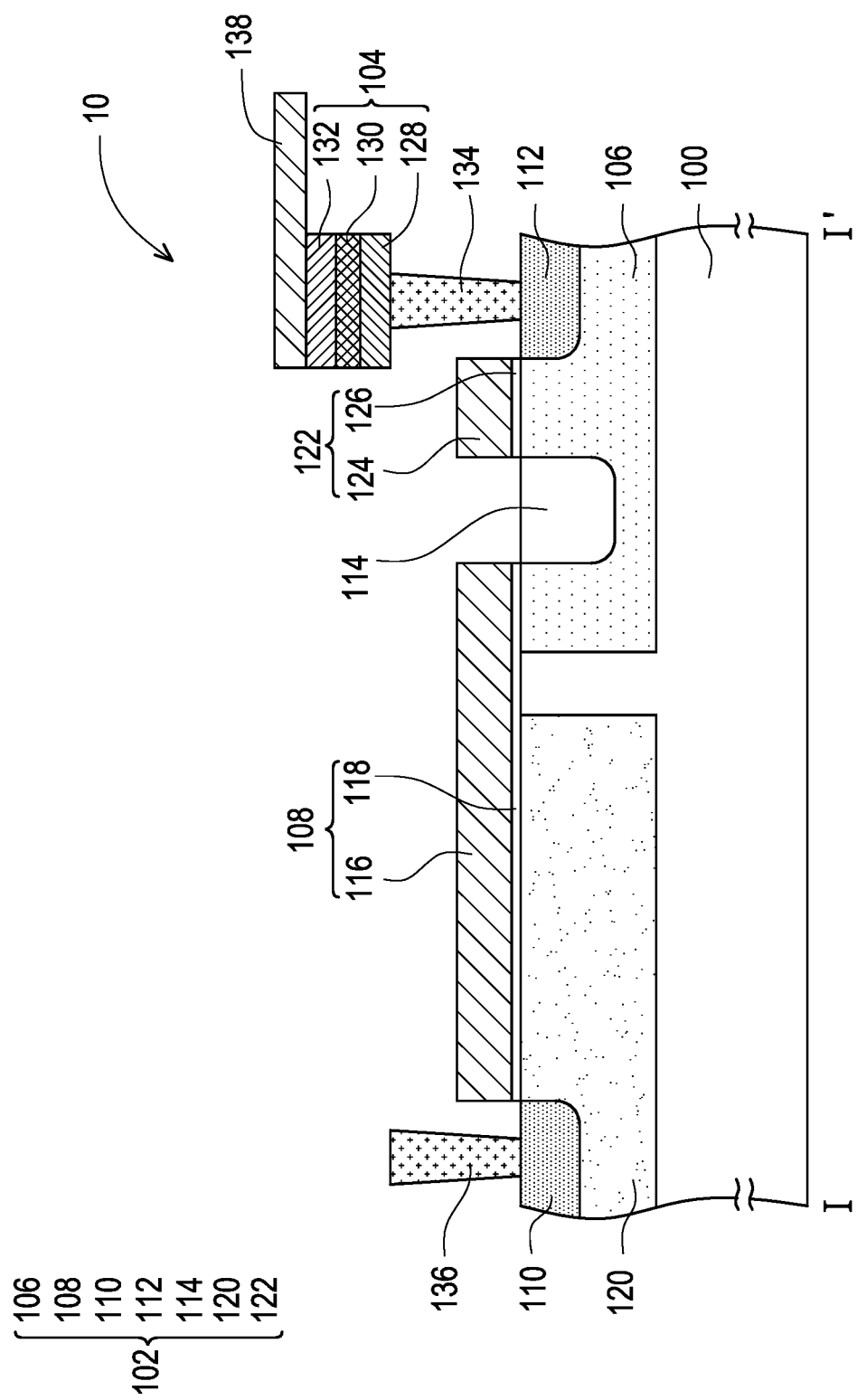
FIG. 1 is a cross-sectional view illustrating a RRAM structure according to an embodiment of the invention.

FIG. 1 is a cross-sectional view illustrating a RRAM structure according to an embodiment of the invention.

Referring to FIG. 1, a RRAM structure 10 includes a substrate 100, a high voltage transistor 102, and a RRAM cell 104. The substrate 100 may be a semiconductor substrate such as a silicon substrate. The substrate 100 may have a first conductive type (e.g., P-type). Hereinafter, the first conductive type and the second conductive type may be different conductive types. The first conductive type and the second conductive type may be one and the other of the P-type and the N-type, respectively. In the present embodiment, the first conductive type is, for example, the P-type, and the second conductive type is, for example, the N-type, but the invention is not limited thereto. In other embodiments, the first conductive type may be the N-type, and the second conductive type may be the P-type.

The high voltage transistor 102 includes a drift region 106, a gate structure 108, a source region 110, a drain region 112, and an isolation structure 114. In some embodiments, the high voltage transistor 102 may be a planar transistor, but the invention is not limited thereto. In some embodiments, the high voltage transistor 102 may be a laterally diffused metal oxide semiconductor (LDMOS) transistor. The drift region 106 is located in the substrate 100. The drift region 106 may have the second conductive type (e.g., N-type).

The gate structure 108 is located on the substrate 100 and on a portion of the drift region 106. The gate structure 108 may include a gate 116 and a dielectric layer 118. The gate 116 is located on the substrate 100. The material of the gate 116 is, for example, doped polysilicon. The dielectric layer 118 is located between the gate 116 and the substrate 100. The material of the dielectric layer 118 is, for example, silicon oxide.

The source region 110 and the drain region 112 are located in the substrate 100 on two sides of the gate structure 108. The drain region 112 is located in the drift region 106. In some embodiment, the source region 110 and the drain region 112 may be doped regions in the substrate 100. The source region 110 and the drain region 112 may have the second conductive type (e.g., N-type).

The isolation structure 114 is located in the drift region 106 and between the gate structure 108 and the drain region 112. In some embodiments, the gate structure 108 may not be located on the isolation structure 114, but the invention is not limited thereto. In another embodiments, the gate structure 108 may be located on at least a portion of the isolation structure 114. In some embodiments, the isolation structure 114 is, for example, a shallow trench isolation (STI) structure.

In some embodiments, the high voltage transistor 102 may further include a well region 120. The well region 120 is located in the substrate 100. The gate structure 108 may be located on a portion of the well region 120. The source region 110 may be located in the well region 120. In the present embodiment, the well region 120 may be separated from the drift region 106, but the invention is not limited thereto. The well region 120 may have the first conductive type (e.g., P-type).

In some embodiments, the high voltage transistor 102 may further include a dummy gate structure 122. The dummy gate structure 122 is located on the substrate 100 and between the isolation structure 114 and the drain region 112. The dummy gate structure 122 may include a dummy gate 124 and a dielectric layer 126. The dummy gate 124 is located on the substrate 100. The material of the dummy gate 124 is, for example, doped polysilicon. The dielectric layer 126 is located between the dummy gate 124 and the substrate 100. The material of the dielectric layer 126 is, for example, silicon oxide.

The RRAM cell 104 includes an electrode 128, a resistive switching layer 130, and an electrode 132 sequentially located on the drain region 112. The RRAM cell 104 is electrically connected to the high voltage transistor 102. For example, the electrode 128 of the RRAM cell 104 may be electrically connected to the drain region 112 of the high voltage transistor 102. The high voltage transistor 102 and the RRAM cell 104 may be connected in series. The material of the electrode 128 is, for example, titanium (Ti), titanium nitride (TiN), tantalum (Ta), or tantalum nitride (TaN). The material of the resistive switching layer 130 is, for example, hafnium oxide ($HfO_2$), aluminum oxide ($Al_2O_3$), zirconium oxide ($ZrO_2$), or a combination thereof. The material of the electrode 132 is, for example, Ti, TiN, Ta, or TaN.

The RRAM structure 10 may further include at least one of a contact 134, a contact 136, and a conductive line 138. The contact 134 is located between the electrode 128 and the drain region 112. The electrode 128 may be electrically connected to the drain region 112 by the contact 134. The contact 136 is electrically connected to the source region 110. The source region 110 may be electrically connected to a source line (not shown) by the contact 136. The conductive line 138 is electrically connected to the electrode 132. In some embodiments, the conductive line 138 may be used as a bit line.

In addition, the RRAM structure 10 may further include the required dielectric layer (not shown) and/or the required interconnection structure (not shown) as needed, and the description thereof is omitted.

Based on the above embodiments, in the RRAM structure 10, the RRAM cell 104 is electrically connected to the high voltage transistor 102. Since the high voltage transistor 102 can sustain high voltage, the high voltage transistor can be prevented from being damaged by the forming voltage of the forming process, thereby improving the electrical performance of the RRAM.

Figure 2A:
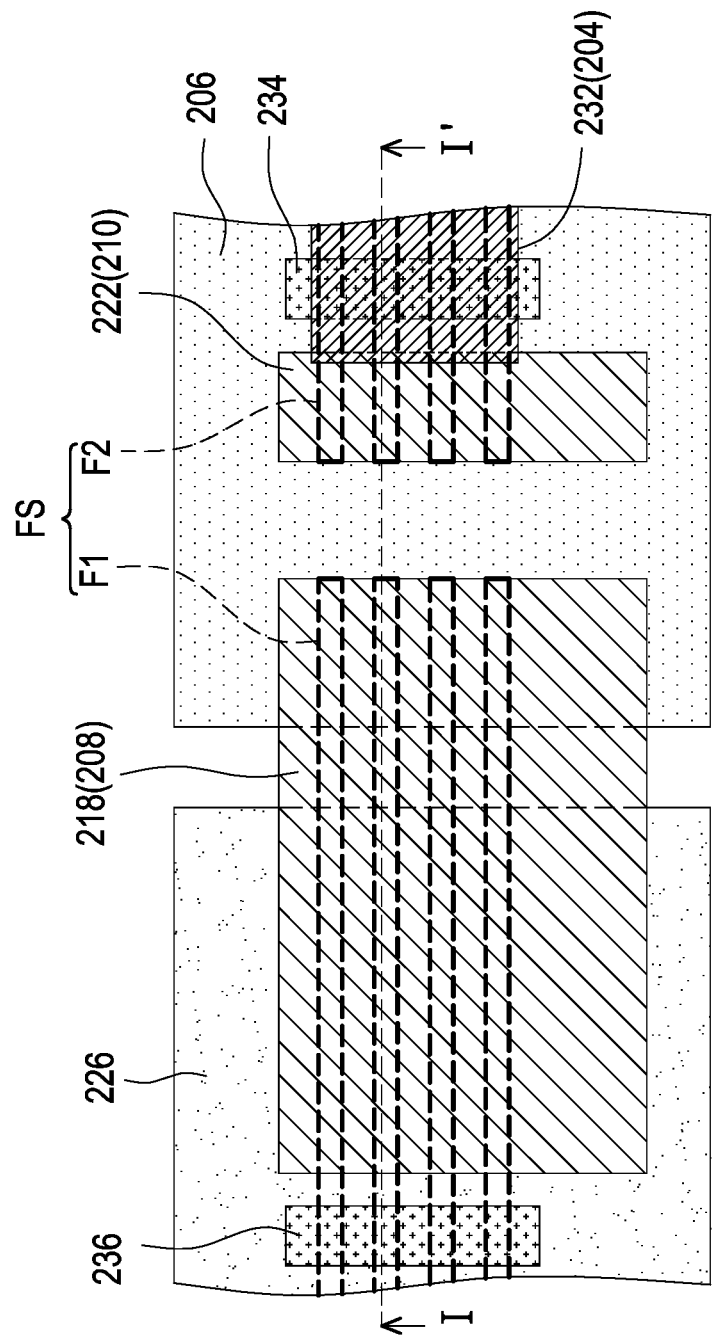
FIG. 2A is a top view illustrating a RRAM structure according to another embodiment of the invention.
Figure 2B:
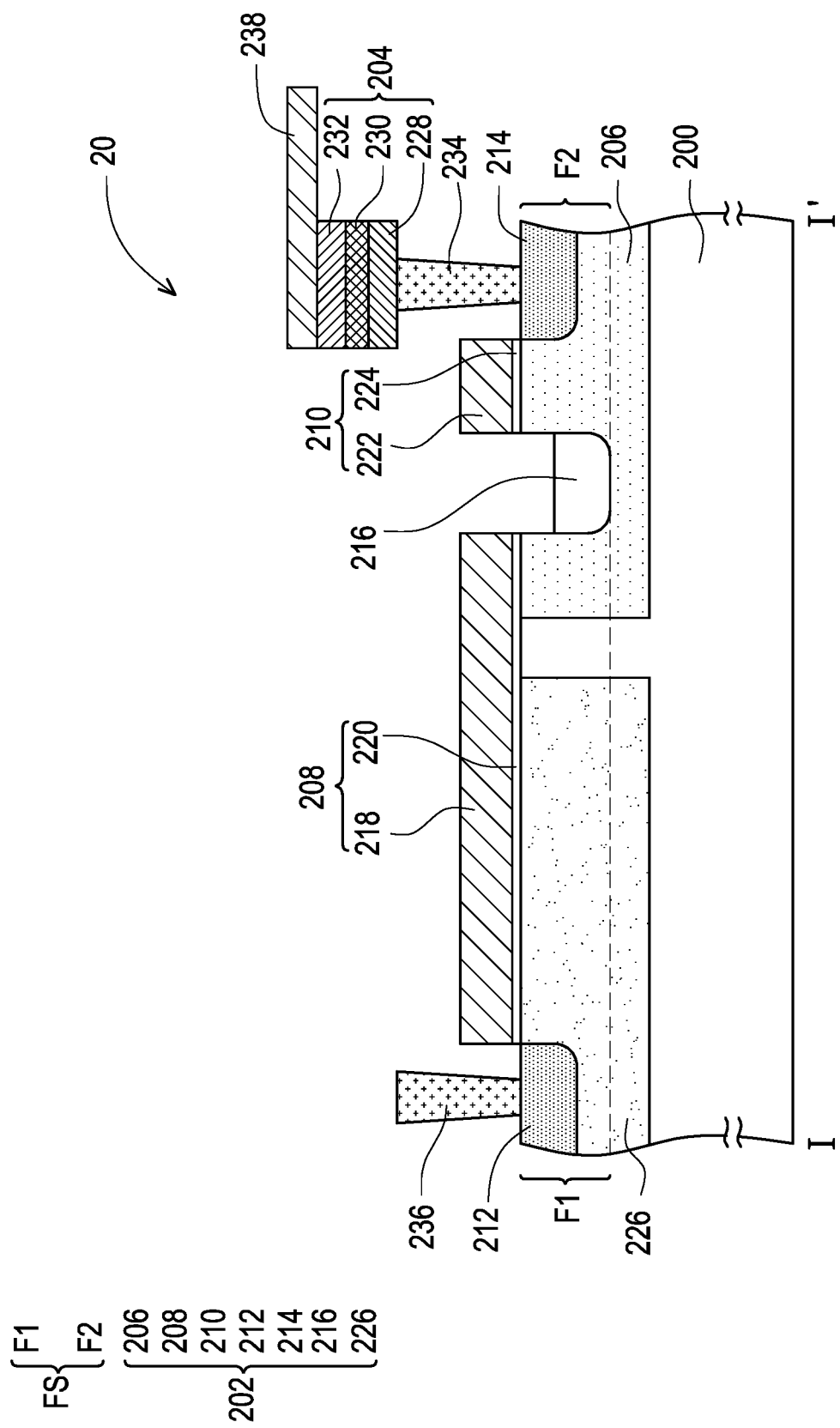
FIG. 2B is a cross-sectional view taken along a section line I-I' in FIG. 2A.

FIG. 2A is a top view illustrating a RRAM structure according to another embodiment of the invention. FIG. 2B is a cross-sectional view taken along a section line I-I' in FIG. 2A. In the top view of FIG. 2A, some of the components in the cross-sectional view of FIG. 2B are omitted to clearly describe the configuration relationship between the components in FIG. 2A.

Referring to FIG. 2A and FIG. 2B, a RRAM structure 20 includes a substrate 200, a high voltage transistor 202, and a RRAM cell 204. The substrate 200 has at least one fin structure FS. The fin structure FS may include at least one fin F1 and at least one fin F2. The fin F1 and the fin F2 may be separated from each other. In the present embodiment, the number of the fins F1 may be the same with the number of the fins F2, but the invention is not limited thereto. In another embodiments, the number of the fins F1 may be different from the number of the fins F2. The substrate 200 may be a semiconductor substrate such as a silicon substrate. The substrate 200 may have a first conductive type (e.g., P-type). Hereinafter, the first conductive type and the second conductive type may be different conductive types. The first conductive type and the second conductive type may be one and the other of the P-type and the N-type, respectively. In the present embodiment, the first conductive type is, for example, the P-type, and the second conductive type is, for example, the N-type, but the invention is not limited thereto. In other embodiments, the first conductive type may be the N-type, and the second conductive type may be the P-type.

The high voltage transistor 202 includes a drift region 206, a gate structure 208, a dummy gate structure 210, a source region 212, a drain region 214, and an isolation structure 216. The high voltage transistor 202 may be a fin field effect transistor (FinFET). In some embodiments, the high voltage transistor 202 may be a laterally diffused metal oxide semiconductor (LDMOS) transistor. The drift region 206 is located in the fin structure FS. In the present embodiment, the drift region 206 may be located in the fin F1, the fin F2, and the substrate 200. The drift region 206 may have the second conductive type (e.g., N-type).

The gate structure 208 is located on the fin structure FS and on a portion of the drift region 206. In the present embodiment, the gate structure 208 may be located on the fin F1. The gate structure 208 may include a gate 218 and a dielectric layer 220. The gate 218 is located on the fin F1. The dielectric layer 220 is located between the gate 218 and the fin F1. In some embodiments, the gate 218 and the dielectric layer 220 may be formed by high-k metal gate (HKMG) technology, but the invention is not limited thereto.

The dummy gate structure 210 is located on the fin structure FS and on the drift region 206. In the present embodiment, the dummy gate structure 210 may be located on the fin F2. The dummy gate structure 210 may include a dummy gate 222 and a dielectric layer 224. The dummy gate 222 is located on the fin F2. The dielectric layer 224 is located between the dummy gate 222 and the fin F2. In some embodiments, the dummy gate 222 and the dielectric layer 224 may be formed by high-k metal gate (HKMG) technology, but the invention is not limited thereto.

The source region 212 and the drain region 214 are located in the fin structure FS on two sides of the gate structure 208 and the dummy gate structure 210. In the present embodiment, the source region 212 may be located in the fin F1, and the drain region 214 may be located in the fin F2. The drain region 214 is located in the drift region 206. The materials of the source region 212 and the drain region 214 may include SiGe, SiGeB, Ge, GeSn, SiC, SiP, or SiCP, a combination of SiC/SiP, or the like. In some embodiments, the source region 212 and the drain region 214 may be doped with dopants. The source region 212 and the drain region 214 may have the second conductive type (e.g., N-type).

The isolation structure 216 is located in the drift region 206 and between the gate structure 208 and the dummy gate structure 210. The fin F1 and the fin F2 may be separated from each other by the isolation structure 216. In some embodiments, the gate structure 208 may not be located on the isolation structure 216, but the invention is not limited thereto. In another embodiments, the gate structure 208 may be located on at least a portion of the isolation structure 216. In some embodiments, the isolation structure 216 is, for example, a shallow trench isolation (STI) structure.

In some embodiments, the high voltage transistor 202 may further include a well region 226. The well region 226 is located in the fin structure FS. In the present embodiment, the well region 226 may be located in the fin F1 and the substrate 200. The gate structure 208 may be located on a portion of the well region 226. The source region 212 may be located in the well region 226. In the present embodiment, the well region 226 may be separated from the drift region 206, but the invention is not limited thereto. The well region 226 may have the first conductive type (e.g., P-type).

The RRAM cell 204 includes an electrode 228, a resistive switching layer 230, and an electrode 232 sequentially located on the drain region 214. The RRAM cell 204 is electrically connected to the high voltage transistor 202. For example, the electrode 228 of the RRAM cell 204 may be electrically connected to the drain region 214 of the high voltage transistor 202. The high voltage transistor 202 and the RRAM cell 204 may be connected in series. The material of the electrode 228 is, for example, Ti, TiN, Ta, or TaN. The material of the resistive switching layer 230 is, for example, hafnium oxide ($HfO_2$), aluminum oxide ($Al_2O_3$), zirconium oxide ($ZrO_2$), or a combination thereof. The material of the electrode 232 is, for example, Ti, TiN, Ta, or TaN.

The RRAM structure 20 may further include at least one of a contact 234, a contact 236, and a conductive line 238. The contact 234 is located between the electrode 228 and the drain region 214. The contact 234 may be a slot contact. The electrode 228 may be electrically connected to the drain region 214 by the contact 234. The contact 236 is electrically connected to the source region 212. The source region 212 may be electrically connected to a source line (not shown) by the contact 236. The contact 236 may be a slot contact. The conductive line 238 is electrically connected to the electrode 232. In some embodiments, the conductive line 238 may be used as a bit line.

In addition, the RRAM structure 20 may further include the required dielectric layer (not shown) and/or the required interconnection structure (not shown) as needed, and the description thereof is omitted.

Based on the above embodiments, in the RRAM structure 20, the RRAM cell 204 is electrically connected to the high voltage transistor 202. Since the high voltage transistor 202 can sustain high voltage, the high voltage transistor can be prevented from being damaged by the forming voltage of the forming process, thereby improving the electrical performance of the RRAM.

In summary, since the RRAM structure of the aforementioned embodiments uses the high voltage transistor as the transistor electrically connected to the RRAM cell, the electrical performance of the RRAM can be improved.

Although the invention has been described with reference to the above embodiments, it will be apparent to one of ordinary skill in the art that modifications to the described embodiments may be made without departing from the spirit of the invention. Accordingly, the scope of the invention is defin structured by the attached claims not by the above detailed descriptions.

What is claimed is:
1. A resistive random access memory (RRAM) structure, comprising:
   a substrate;
   a high voltage transistor comprising:
      a drift region located in the substrate;
      a gate structure located on the substrate and on a portion of the drift region;
      a source region and a drain region located in the substrate on two sides of the gate structure, wherein the drain region is located in the drift region; and an isolation structure located in the drift region and between the gate structure and the drain region; and a RRAM cell comprising a first electrode, a resistive switching layer, and a second electrode sequentially located on the drain region, wherein the RRAM cell is electrically connected to the high voltage transistor.

2. The RRAM structure according to claim 1, wherein the high voltage transistor and the RRAM cell are connected in series.

3. The RRAM structure according to claim 1, wherein the first electrode is electrically connected to the drain region.

4. The RRAM structure according to claim 1, further comprising:
a contact located between the first electrode and the drain region.

5. The RRAM structure according to claim 1, wherein the high voltage transistor further comprises:
a well region located in the substrate.

6. The RRAM structure according to claim 5, wherein the gate structure is located on a portion of the well region.

7. The RRAM structure according to claim 5, wherein the source region is located in the well region.

8. The RRAM structure according to claim 5, wherein the well region is separated from the drift region.

9. The RRAM structure according to claim 5, wherein the well region has a first conductive type, and the drift region, the source region, and the drain region have a second conductive type.

10. The RRAM structure according to claim 1, wherein the high voltage transistor further comprises:
a dummy gate structure located on the substrate and between the isolation structure and the drain region.

11. A RRAM structure, comprising:
a substrate having at least one fin structure;
a high voltage transistor comprising:
a drift region located in the fin structure;
a gate structure located on the fin structure and on a portion of the drift region;
a dummy gate structure located on the fin structure and on the drift region;
a source region and a drain region located in the fin structure on two sides of the gate structure and the dummy gate structure, wherein the drain region is located in the drift region; and
an isolation structure located in the drift region and between the gate structure and the dummy gate structure; and
a RRAM cell comprising a first electrode, a resistive switching layer, and a second electrode sequentially located on the drain region, wherein the RRAM cell is electrically connected to the high voltage transistor.

12. The RRAM structure according to claim 11, wherein the high voltage transistor and the RRAM cell are connected in series.

13. The RRAM structure according to claim 11, wherein the first electrode is electrically connected to the drain region.

14. The RRAM structure according to claim 11, further comprising:
a contact located between the first electrode and the drain region.

15. The RRAM structure according to claim 14, wherein the contact comprises a slot contact.

16. The RRAM structure according to claim 11, wherein the high voltage transistor further comprises:
a well region located in the fin structure.

17. The RRAM structure according to claim 16, wherein the gate structure is located on a portion of the well region.

18. The RRAM structure according to claim 16, wherein the source region is located in the well region.

19. The RRAM structure according to claim 16, wherein the well region is separated from the drift region.

20. The RRAM structure according to claim 16, wherein the well region has a first conductive type, and the drift region, the source region, and the drain region have a second conductive type.

* * * * *